(12) United States Patent
Skerritt

(10) Patent No.: US 7,375,592 B2
(45) Date of Patent: May 20, 2008

(54) SYSTEM AND METHOD FOR MAINTAINING AN ACCURATE FREQUENCY ON A VOLTAGE CONTROLLED OSCILLATOR

(75) Inventor: Michael Skerritt, Oak Hill, VA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 10/530,809

(22) PCT Filed: Oct. 9, 2003

(86) PCT No.: PCT/US03/32158

§ 371 (c)(1),
(2), (4) Date: Dec. 6, 2005

(87) PCT Pub. No.: WO2004/032597

PCT Pub. Date: Apr. 22, 2004

(65) Prior Publication Data

US 2006/0109059 A1 May 25, 2006

Related U.S. Application Data

(60) Provisional application No. 60/416,924, filed on Oct. 9, 2002.

(51) Int. Cl.
*H03L 7/00* (2006.01)

(52) U.S. Cl. .................. 331/16; 331/34; 331/1 A; 331/18
(58) Field of Classification Search ............ 331/16, 331/34, 18, 1 A
See application file for complete search history.

(56) References Cited

U.S. PATENT DOCUMENTS 3,883,817 A 5/1975 Cliff
6,005,425 A * 12/1999 Cho .................. 327/156

* cited by examiner

*Primary Examiner*—Arnold Kinkead
(74) *Attorney, Agent, or Firm*—Miles & Stockbridge PC

(57) ABSTRACT

A method for phase-locking a voltage controlled oscillator is disclosed. The method comprises receiving, at a phase detector, a phase input signal and a phase feedback signal from the voltage controlled oscillator; measuring a pulse width property of an error signal output from the phase detector to obtain a pulse width property measurement; storing the pulse width property measurement in a memory; and generating a new signal from the stored pulse width property measurement to phase-lock the voltage controlled oscillator. The method of the present invention may be used to calibrate a clock, in clock holdover and in qualification of clock sources.

16 Claims, 7 Drawing Sheets

SYSTEM AND METHOD FOR MAINTAINING AN ACCURATE FREQUENCY ON A VOLTAGE CONTROLLED OSCILLATOR

CROSS-REFERENCE TO RELATED APPLICATION

This application claims the benefit of U.S. provisional patent application No. 60/416,924 filed Oct. 9, 2002, which is hereby incorporated by reference.

INTRODUCTION

Synchronization between transmitting and receiving data equipment of analog signals is employed in today's analog and digital electronic systems. In traditional communication systems, sending and receiving data equipment are synchronized to a central clock frequency. Accuracy in the synchronization is vital to the successful transmission and reception of data in such systems.

One well-known circuit for maintaining high-resolution frequency synchronization among clocks in digital and analog communication systems is a Phase Locked Loop (PLL). PLLs are used in numerous types of devices and circuits for clock signal recovery, clock signal multiplication, or for the synthesis of multiple clock frequencies. FIG. 1 shows a block diagram of a basic PLL circuit 100. The operation of circuit 100 is typical of most PLLs. A frequency reference phase input signal 102 is received at one input by a phase detector 104. Input signal 102 is usually from a highly accurate system clock. At a second input, phase detector 104 receives phase feedback signal 106 from a divide by N counter 108. Thus, the phase detector 104 can compare the phase and frequency of input signal 102 and phase feedback signal 106. Phase output signal 110 is a voltage proportional to the phase difference between the two inputs 102, 106 and is commonly known as the error signal. Phase output signal 110 passes through a low pass filter 112 that delivers a voltage signal 114 at its output based on the width of the pulses at its input. Voltage signal 114 is applied to a Voltage Controlled Oscillator (VCO) 116 to control the frequency of output signal 118. Output signal 118 is used in a designated system and is also provided to counter 108 in the feedback loop. The PLL is in "lock" when there is a constant phase and frequency relationship between the two inputs 102 and 106 to the detector 104.

One particular type of PLL uses a Voltage Controlled Crystal Oscillator (VCXO). VCXOs are designed to provide a variable frequency output based on voltage input. Although frequency variability of the VCXO is generally very limited, for example on the margin of less than 100 parts per million, more expensive VCXO's may provide greater flexibility for frequency output variability.

Most VCXO's are initially calibrated during production at a certain guaranteed frequency accuracy relative to a known frequency standard. It is well-known to those skilled in the art that the most common frequency standards are represented by four levels of accuracy, from Stratum 1 to Stratum 4, wherein Stratum 1 is the most accurate and Stratum 4 is the least accurate. Stratum 3 is most common and has an accuracy of ±4.6 parts per million from Stratum 1 accuracy. A process known as drifting, in which an oscillator "drifts" from its factory calibrated frequency poses a significant problem for synchronization among clocks. Changes in environmental factors such as temperature, humidity, and power supplied to the VCXO, as well as crystal aging may result in changes in the frequency timing of the VCXO. For example, a VCXO calibrated to Stratum 3 under certain factory or manufacturing conditions may be used in a communication system operating under different conditions. As a result, the VCXO may no longer be dependable to Stratum 3 accuracy.

This drift problem becomes significant in the event that the reference input signal disappears or becomes unsuitable for proper operation of the PLL. The reference signal may disappear under a variety of unwanted network conditions such as a network outage, system failure, etc. One technique common in the prior art for handling such an event is to let the VCXO run at its factory-calibrated frequency. A PLL operating at this factory-calibrated frequency is said to be operating at its free-running frequency. While this may be sufficient if the free-running frequency is very close to the lost reference frequency, this is often not the case. Letting a PLL run at its free-running frequency can result in catastrophic consequences in a number of situations such as, for example, if the free-running frequency has drifted from the factory calibrated frequency or if the factory calibrated frequency was incorrect altogether.

To compensate for changes in these factors and correct the resulting frequency offset, PLLs may incorporate a number of environmental control features. Ovens for maintaining consistent temperature or humidity, or a system for power management to the PLL are often employed to prevent drifting and guarantee accuracy to the VCXO's calibrated free-running frequency. However, these control features pose a disadvantage as they substantially increase the cost of PLLs.

A technique known as clock-holdover, wherein the PLL frequency output continues to operate at its last "locked" frequency before loss of the reference clock, is often employed when a reference clock signal disappears. Clock-holdover can be performed with digitally controlled PLLs, where the control voltage to the VCXO is generated by a Digital to Analog Converter (DAC). Holdover can be achieved by finding a single numeric value representative of the last locked frequency signal. However, existing PLLs that implement a clock-holdover feature have this single, numeric value programmed to the DAC to output a specific frequency. This system for employing clock-holdover therefore becomes complex, requiring a DAC which adds unwanted financial and power consumption costs.

The present invention provides a system and method for synthesizing a signal that simulates either an existing or defunct reference clock signal. The system comprises a PLL circuit having a voltage controlled oscillator (e.g. a VCXO) connected in a feedback loop arrangement. In one embodiment, the operation of the PLL includes receiving a phase input signal and a phase feedback signal from the feedback loop at a phase detector, measuring the pulse width of the signal output from the phase detector, storing the pulse width of the duty cycle in non-volatile memory, and maintaining an accurate frequency of the VCXO when needed by generating a new signal from the pulse width measurement. Significantly, the system of the present invention does not require a DAC to synthesize a reference clock signal.

BRIEF DESCRIPTION OF THE DRAWINGS

In the drawings, where like reference numbers refer to like elements throughout the several views.

DETAILED DESCRIPTION

Figure 1:
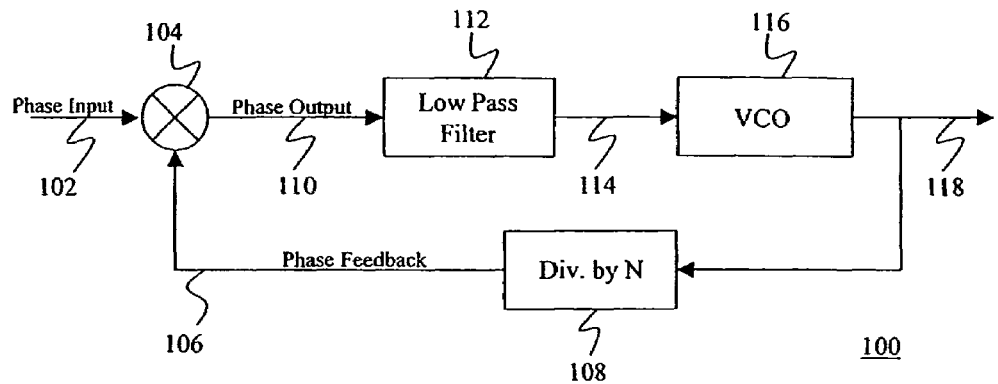
FIG. 1 (PRIOR ART) shows a block diagram of a basic PLL circuit.
Figure 2:
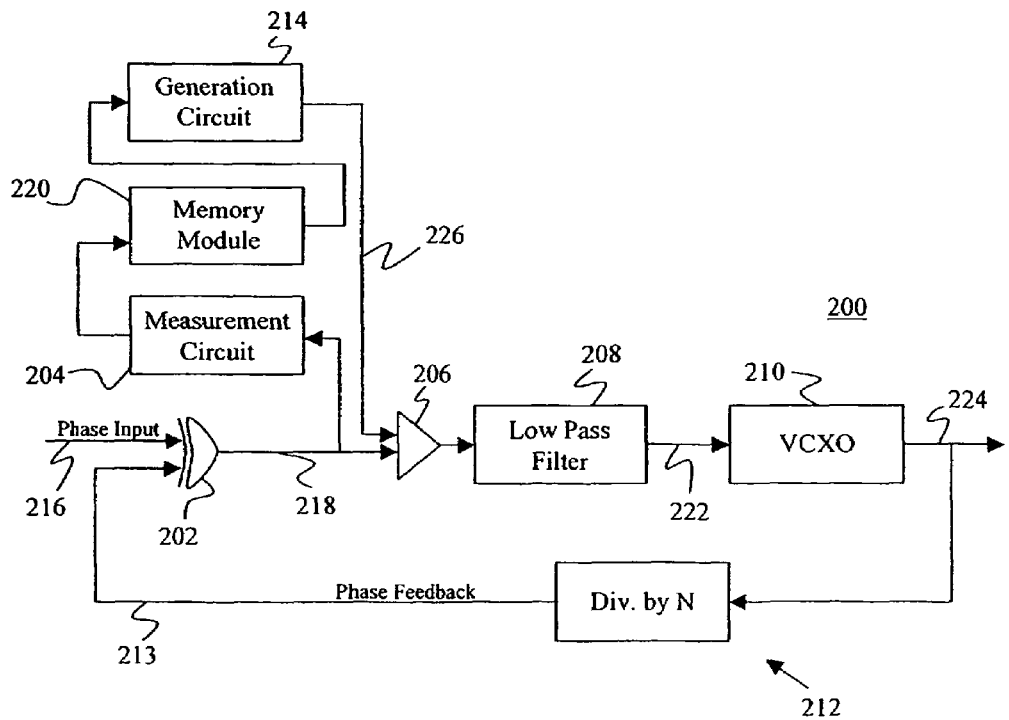
FIG. 2 shows a block diagram of an EXOR PLL circuit according to the present invention.

FIG. 2 shows a block diagram of an EXOR PLL circuit 200 in accordance with the present invention. EXOR PLL 200 comprises an EXOR phase detector 202, a signal measurement circuit 204, a MUX 206, a low pass filter 208, a VCXO 210, a feedback loop 212, a memory module 220, and a signal generation circuit 214.

Phase detector 202 is a two-input EXOR binary logic gate. Phase detector 202 is configured to receive a phase input signal 216 and a phase feedback signal 213 from VCXO 210 via feedback loop 212. Phase input signal 216, which may be derived from a reference clock signal, has a frequency denominator common to that of feedback signal 213 for phase comparison. A counter may be used to provide divider values for deriving phase input signal 216 from the reference clock signal, although it should be appreciated that any method for obtaining phase input signal 216 with a pulse train equivalent to feedback signal 213 is sufficient. EXOR phase detector 202 performs EXOR binary logic functions comparing phase and frequency of inputs 213, 216 to produce a phase output error signal 218 with an equivalent pulse train.

Measurement circuit 204 receives error signal 218 from phase detector 202. Measurement circuit 204 digitally measures a pulse width property of error signal 218 to obtain a pulse width measurement. Measurement circuit 204 stores the pulse width measurement to memory 220. Memory 220 is preferably non-volatile memory; however, it should be appreciated that the memory may encompass other types. In a preferred form of the present embodiment, the pulse width measurement comprises a pulse width measurement of a high voltage signal value and a pulse width measurement of a low voltage signal value of error signal 218. A higher frequency clock or high frequency counter may be used to obtain the pulse width measurement. The pulse width may be measured in any units, though it is normally measured in a unit of time.

Error signal 218 is also received at two-input MUX 206. MUX 206 allows error signal 218 to serve as input to low pass filter 208. Low pass filter 208 determines the dynamic characteristics of PLL circuit 200. Based on the pulse width property of error signal 218, low pass filter 208 generates a DC voltage output 222 to VCXO 210 which works to adjust the frequency and phase of output signal 224 to correct for error, thereby phase-locking PLL 200.

When needed, generation circuit 214 generates a new signal 226 to maintain an accurate frequency input for VCXO 210. The previously stored pulse width measurement may be retrieved from memory 220 by signal generation circuit 214. This retrieved value is used by generation circuit 214 to synthesize new signal 226 for input to MUX 206. MUX 206 rejects passage of error signal 218 to low pass filter 208 and instead permits new signal 226 to serve as input to low pass filter 208. Output signal 224 of VCXO 210 will now be adjusted with respect to the waveform of generated signal 226.

Generally, if phase input signal 216 is received by circuit 200, error signal 218 will serve as input to low pass filter 208. Occasionally, however, phase input signal 226 may not be received. For example, the clock reference signal may disappear or become unsuitable. If phase input signal 216 is not received by circuit 200, passage of error signal 218 is rejected in favor of new signal 226. In addition, as discussed later herein, circumstances exist in which circuit 200 receives phase input signal 216 yet retrieval of the stored measurement and use of generated signal 226 is still desirable.

Error signal 218 has a pulse width proportional to the phase difference between phase input signal 216 and feedback signal 213. The measurement of this proportion is expressed as the ratio of high to low voltage signal values. Commonly referred to as duty cycle, the proportion may be expressed as a percentage of the time a voltage signal spends at a high voltage value within a single clock period divided by the total clock period time. For example, an error signal 218 having a 50% duty cycle indicates a 1:1 proportional relationship between time spent at the high and low voltage signal values and that VXO 210 is operating close to its center frequency when the PLL is in lock.

Figure 3:
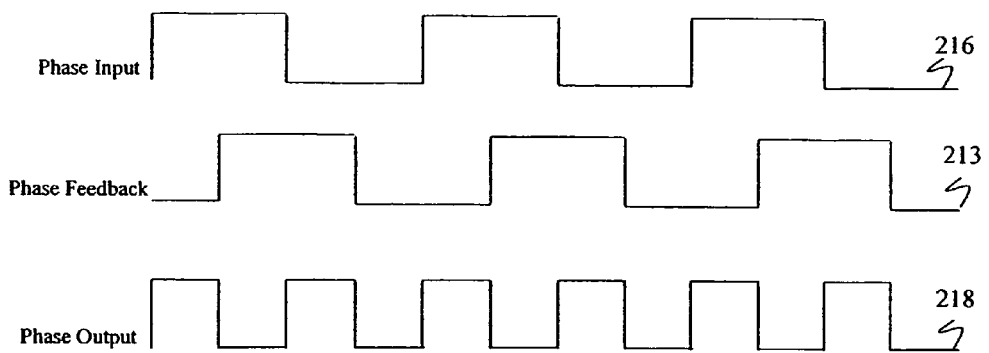
FIG. 3 shows a waveform diagram of an error signal in the EXOR PLL circuit of the present invention that is operating close to the VCXO's center frequency.

FIG. 3 shows a waveform diagram of phase input signal 216 in EXOR combination with feedback signal 213 to yield error signal 218. Applying the basic EXOR logic to phase input signal 216 and feedback signal 213, error signal 218 will be at a low voltage level when signals 216, 213 have similar values and a high voltage level when signals 216, 213 have differing values. Signals 216, 213 are operating at a phase offset of 90 degrees in the example of FIG. 3, which inherently generates error signal 218 having a 50% duty cycle, where there is a 1 to 1 relationship between time spent at the high and low signal levels and VCXO 210 is operating very close to its center frequency. Assuming that the waveforms of FIG. 3 are in lock, the center frequency of VCXO 210 is close enough to a multiple of phase input signal 216 that if phase input signal 216 of the reference clock disappeared, VCXO 210 could operate at a free-running frequency without catastrophic consequences.

Figure 4:
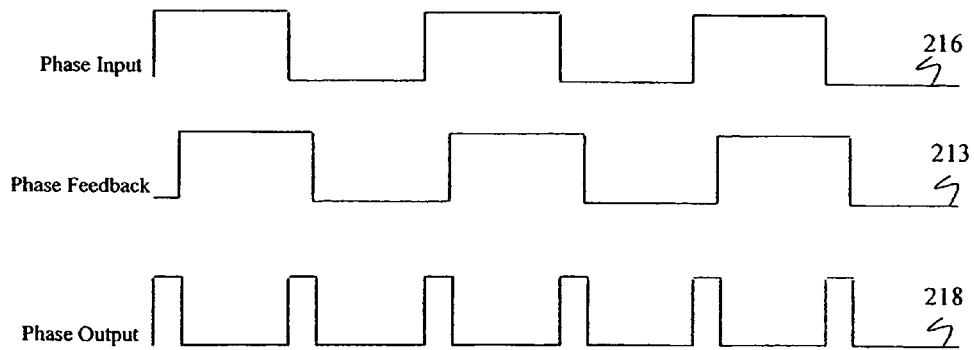
FIG. 4 shows a waveform diagram of an error signal in the EXOR PLL circuit of the present invention that is operating at the low end of the VCXO's frequency range.

However, the center frequency output of VCXO 210 is not always so close to a multiple of the frequency of phase input signal 216. For example, FIG. 4 shows a waveform diagram of the PLL circuit of FIG. 2 in lock, with phase input signal 216 in EXOR combination with feedback signal 213 to produce error signal 218. Phase input signal 216 and feedback signal 213 no longer have a phase relationship of 90 degrees, and error signal 218 now has a duty cycle of less than 10%. In this situation, VCXO is forced to operate at the low end of its frequency range, which is not a multiple of phase input signal 216. If phase input signal 216 from the reference clock were to disappear, VCXO 210 could not run at its center frequency because voltage swings of output signal 224 are not synchronized with voltage swings of phase input signal 216. Letting VCXO 210 run at its center frequency could result in catastrophic consequences. In these circumstances, the present invention's generation circuit 214 can generate new signal 226 to replace phase input signal 216, thereby allowing PLL 200 to continue operating without error in a locked state.

Figure 5:
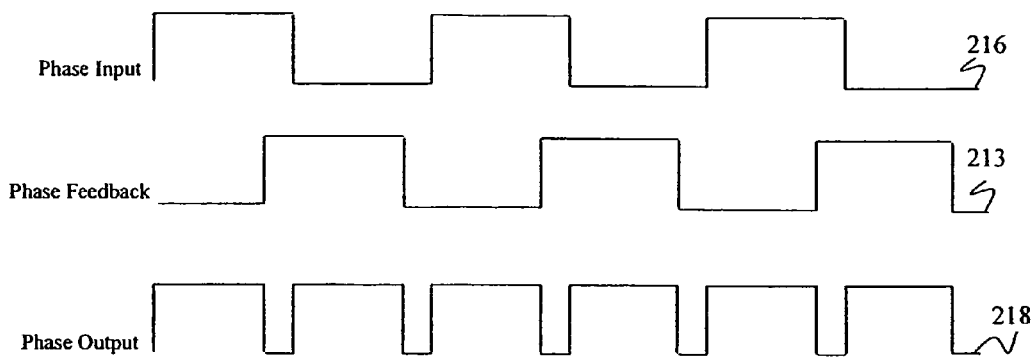
FIG. 5 shows a waveform diagram of an error signal in the EXOR PLL circuit of the present invention that is operating at the high end of the VCXO's frequency range.

As another example, FIG. 5 shows a phase input signal 216 and phase feedback signal 213 having a phase offset of more than 90 degrees, with VCXO 210 operating at the high end of its frequency range to keep the PLL in lock. If reference signal 216 were to disappear, letting VCXO 210 run at its center frequency could result in catastrophic consequences. In these circumstances, the present invention generation circuit 214 can generate new signal 226 to replace phase input signal 216 thereby allowing PLL 200 to continue operating without error in a locked state.

Figure 6:
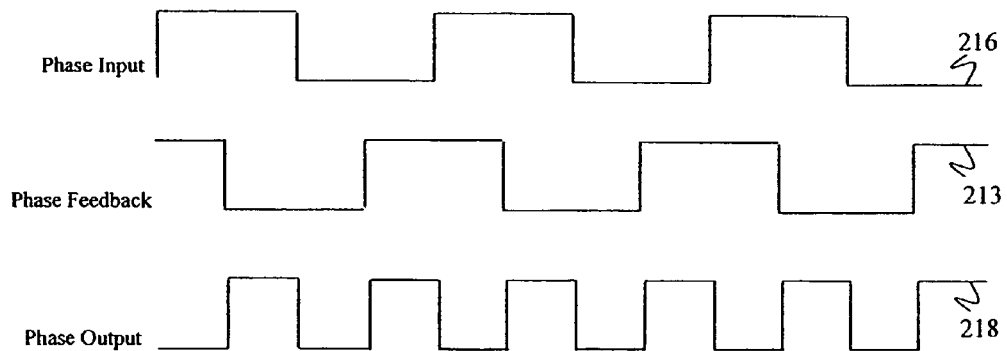
FIG. 6 shows a waveform diagram of a phase input signal and phase feedback signal having a phase offset of more than 180 degrees.

In addition to maintaining an accurate frequency for VCXO 210 at a loss of phase input signal 216, the present invention provides methods of determining that phase input signal 216 has become unsuitable, and thereupon generating and using signal 226 to maintain an accurate frequency of VCXO 210 under these conditions. FIG. 6 shows a phase input signal 216 and phase feedback signal 213 having a phase offset of more than 180 degrees, or a half clock cycle. Consequently, PLL 200 will be unable to lock to phase input signal 216. Even though circuit 200 still receives phase input signal 216, it has become unsuitable. In a preferred embodiment of the present invention, this situation is detected, and the generated signal 226 is used instead of error signal 218.

In one embodiment of the present invention, generation circuit 214 comprises an edge-triggered D flip-flop for detecting when the rising edge of signal 213 crosses the falling edge of signal 216. With the D input receiving signal 216 and the clock input receiving 213, the Q output will change when PLL 200 cannot lock to signal 216. In this situation, the inventive system will cause generation circuit 214 to generate new signal 226 to replace phase input signal 216 and continue operating on a locked signal.

Figure 7:
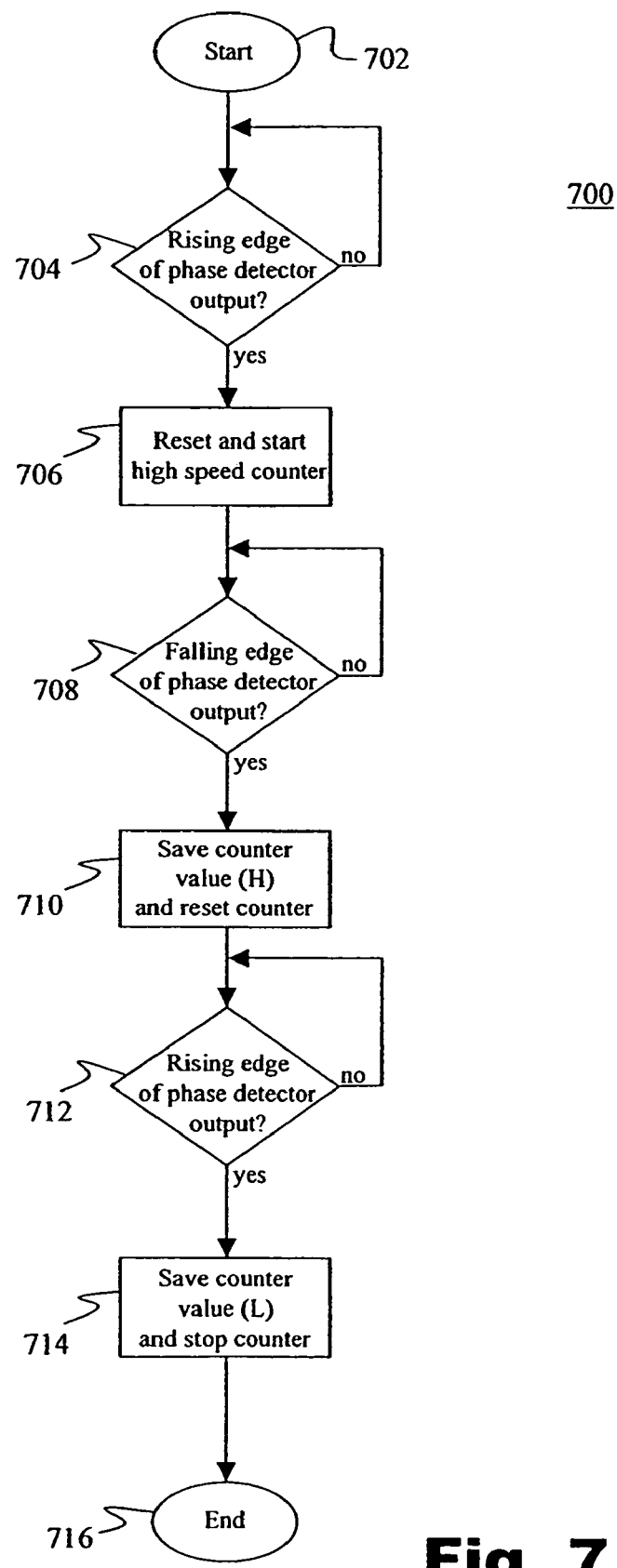
FIG. 7 shows a flow chart of control flow of an EXOR PLL measurement process.

FIG. 7 shows a flow chart of a measurement process 700 that may be performed by measurement circuit 204 for measuring error signal 218. Measurement process 700 begins at block 702 and continues to decision block 704, where measurement circuit 204 waits for the rising edge of the error signal 218. Once a rising edge of error signal 218 is detected, a high-speed counter of measurement circuit 204 is reset and started at block 706. The counter digitally measures the pulse width of the high value of error signal 218. At decision block 708, measurement circuit 204 awaits the detection of the subsequent falling edge of error signal 218. Upon detection, the counter is stopped at block 710 and its value is saved in memory 220 as the high counter value, hereinafter referred to as Counter Value (H), which maintains the value of the pulse width property of the high voltage signal value of error signal 218. The counter is reset and restarted immediately again as it waits for the subsequent rising edge of error signal 218 at decision block 712. Upon detection, the counter is stopped at block 714 and its value is saved in memory 220 as the low counter value, hereinafter referred to as Counter Value (L), which maintains the value of the pulse width property of the low voltage signal value of error signal 218. Measurement process 700 ends at block 716.

Figure 8:
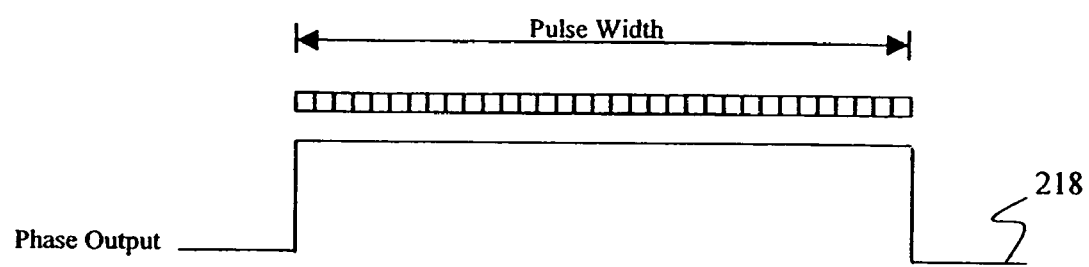
FIG. 8 shows a waveform diagram detailing the pulse width measurement of a high portion of an error signal in accordance with the EXOR PLL circuit of the present invention.

FIG. 8 shows the measurement of the pulse width of the high voltage signal value in accordance with operation of the measurement circuit 204 of FIG. 2. The pulse width measured is Counter Value (H) that is stored in memory 220. The same is performed on the low voltage signal value to measure Counter Value (L), which is also stored in memory 220.

Figure 9:
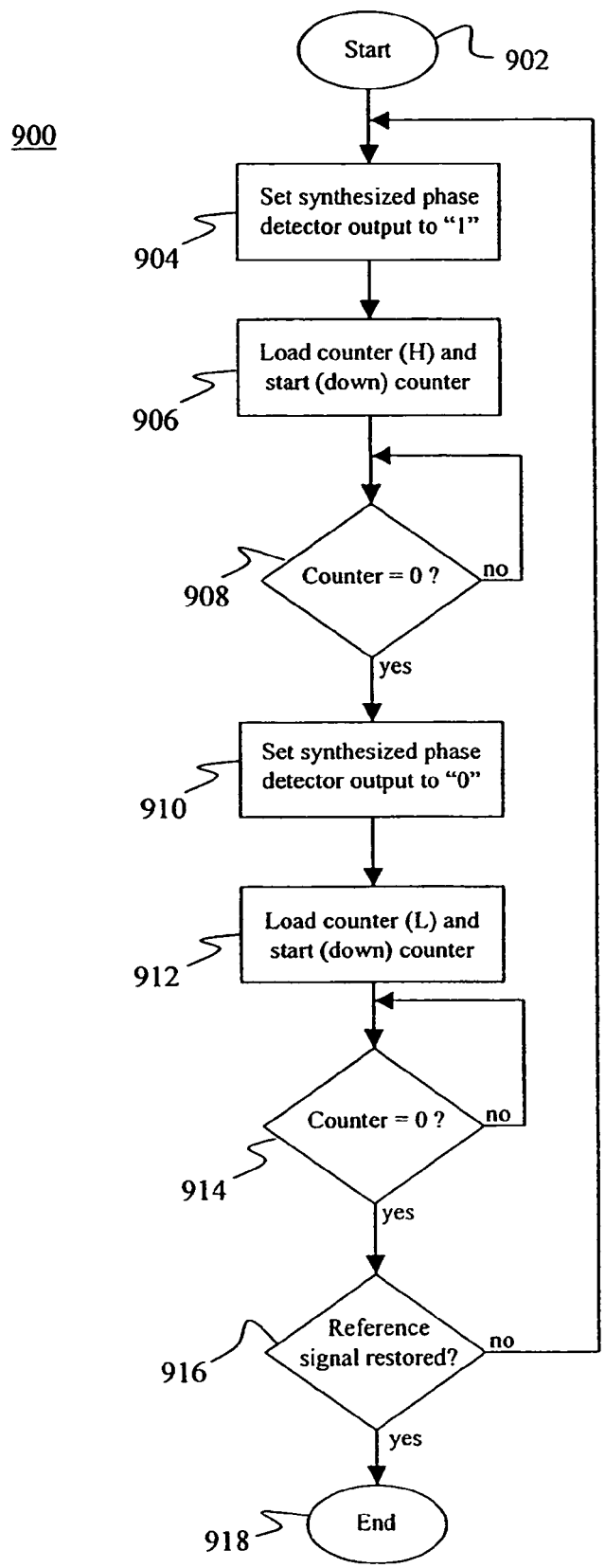
FIG. 9 shows a flow chart of control flow of a EXOR PLL regeneration process.

FIG. 9 shows a flow chart of a regeneration algorithm 900 that manages generation circuit 214 for generating new signal 226.

Regeneration process 900 is initiated at block 902 when conditions dictate that a synthesized signal is needed to maintain the accurate frequency of VCXO 210. For example, as discussed above, the system may detect a loss of phase input signal 216, or it may detect that signal 216 has become unsuitable.

At control block 904, a signal generator is initialized to generate a high value voltage signal. Counter Value (H) is then loaded from memory 220 and the signal generator creates a high value voltage signal in accordance with a counter operating a countdown from Counter Value (H) to 0 at control block 906. Decision block 908 is looped back on itself until the counter reaches 0 or stops, indicating that the appropriate pulse width of the high value voltage signal has been synthesized. Upon termination of the high value voltage signal, the signal generator is initialized to produce a low value voltage signal at control block 910. Counter Value (L) is then loaded from memory 220 and the signal generator creates a low value voltage signal in accordance with a counter operating a countdown from Counter Value (L) to 0 at control block 912. Decision block 914 is looped back on itself until the counter reaches 0 or stops, indicating that the appropriate pulse width property of the low value voltage signal has been generated. At block 916, a check is made to determine if phase input signal 216 can be acquired, for example if the clock reference signal has reappeared. If so, regeneration algorithm 900 ends at block 918. If, however, phase input signal 216 cannot be acquired, for example if the clock reference signal has not reappeared, then control flow loops back to block 904 where regeneration process 900 again generates new signal 226.

Using the inventive measurement and regeneration methods of the present invention, a known waveform can be recreated with counters and logic and injected into the Low Pass Filter to control the frequency output. Unlike other known PLLs, no DAC is needed to convert a number to a corresponding output VCO frequency.

There are at least three primary ways in which the present invention may be used.

Firstly, upon a phase lock to an input phase signal 216, a user could initiate measurement process 700 to "calibrate" the system by storing the pulse width property of error signal 218 to non-volatile memory. In a sense, the system is being "calibrated on-site". Then, if the accurate reference to which PLL 200 is locking were to disappear or become unsuitable, circuit 200 could fall back to this "calibrated" value by invoking regeneration process 900 with the earlier stored value. Since this calibration is done in a place where the environmental conditions are not likely to change, the accuracy of this calibrated frequency will tend to stay accurate for long periods. This represents a significant improvement over the conventional method of defaulting the VCXO to its center frequency, which could be as far as +/−100 ppm from stratum 1.

Secondly, an improved method of clock holdover may be implemented using the present invention. Clock holdover is the ability to maintain the output frequency of a PLL even when the phase input signal disappears. The idea is that it is better to run at a "last known good" frequency rather than letting the VCXO run free. In accordance with the present invention, measurement circuit 204 or measurement process 700 may be invoked at periodic intervals to take measurements of the duty cycle of error signal 218. If the measured value is substantially consistent or satisfies a predetermined condition over a predetermined time period, measurement circuit 204 automatically stores this value, which is to be synthesized using generation circuit 214 if the original clock reference disappears. Measurement circuit 204 may include a timer for initiating periodic measurements. For example, a pulse width measurement may be made every 5 seconds.

Thirdly, the present invention provides a capability for the qualification of potential clock reference sources for the PLL. There are often several possible clock sources configured for a system to lock to, with a priority scheme to determine which input should be used if many are present. The system may perform a qualification of these potential clock sources or references to see if they are acceptable for use by the PLL. For example, the qualification may comprise checking to see if there are transitions, or just checking to see if the reference is accessible. As another example, the qualification may comprise performing a frequency accuracy measurement on a potential reference input to determine its accuracy.

When an accuracy measurement of a potential reference is performed, it is typically performed with the system clock (which is based on the output of the PLL). Therefore, the measured accuracy value of a reference is relative to the system clock. Therefore, when using the system clock, only relative measurements are available, and it is not viable to make the determination of whether the reference is acceptable to use by the PLL. That is, relative measurements cannot be used to determine if the PLL can lock to the potential reference.

For example, suppose a VCXO has a frequency range of +/−100 ppm and it is currently locked to a reference that puts it at −90 ppm of its range. This situation is similar to the situation shown in FIG. 4. If this clock were used to measure the accuracy of a potential reference, the reference may be measured as −20 ppm relative to the system clock. Under normal circumstances one would think that this reference is within the accuracy requirements of +/−100 ppm for a +/−100 ppm VCXO. However, the PLL would not be able to lock to this reference since it would actually require a VCXO range of (−90)+(−20)=−110 ppm.

With the use of measurement circuit 204, the current VCXO frequency output 224 (as a percentage of its whole frequency range) is known. This information, combined with the relative frequency measurement of the potential reference input can be used to make a guaranteed determination whether that reference can be locked to by EXOR PLL 200. This capability also makes maximal use of the VCXO frequency range, rather than restricting it to an artificially smaller frequency range to compensate for the problem described above.

Figure 10:
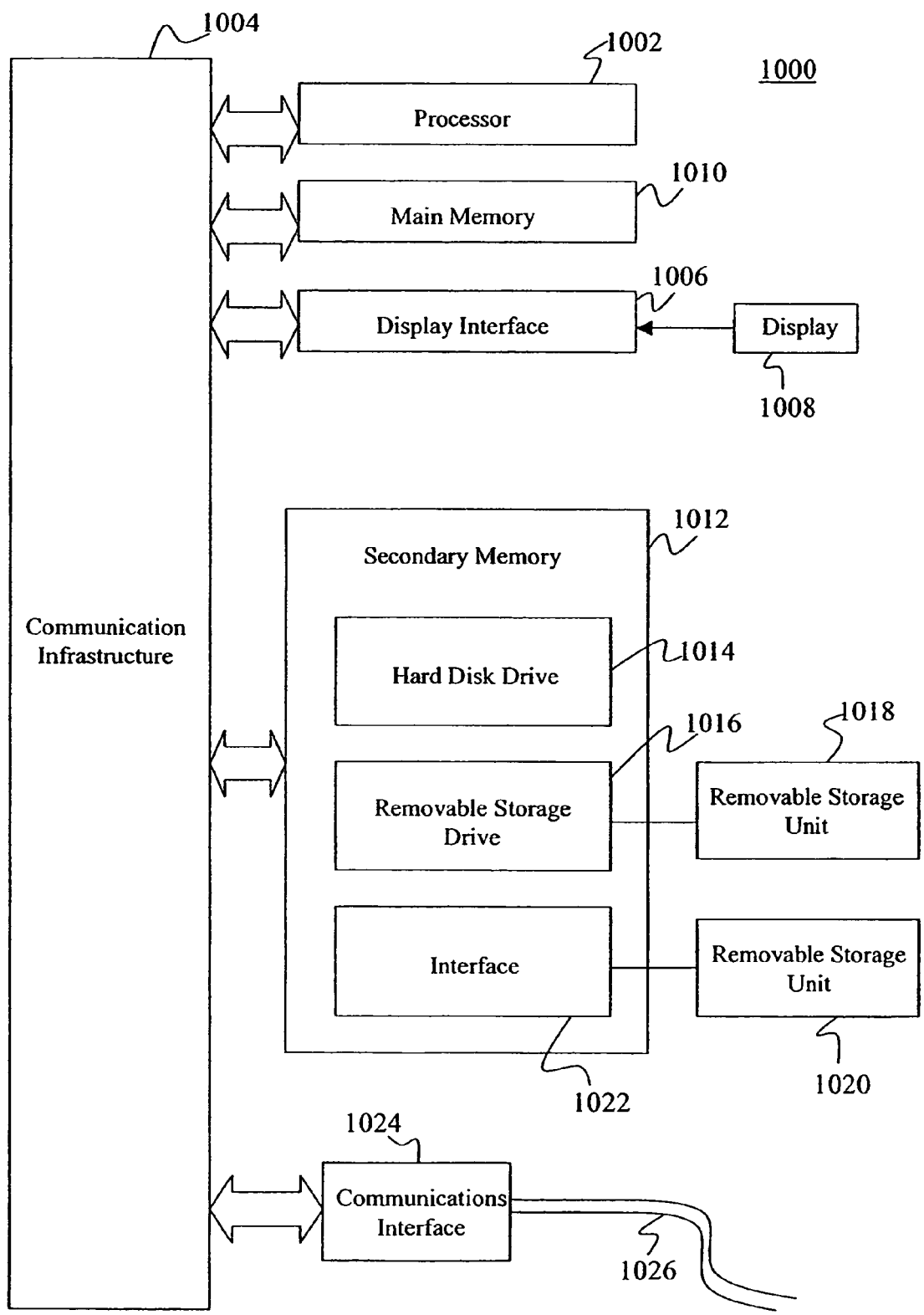
FIG. 10 shows a block diagram of a computer system in accordance with one embodiment of the invention

The present invention may be implemented using hardware, software or a combination thereof and may be implemented in one or more computer systems or other processing systems. In fact, in one embodiment, the invention is directed toward one or more computer systems capable of carrying out the functionality described herein. An example of a computer system 1000 is shown in FIG. 10. Computer system 1000 includes one or more processors, such as processor 1002. Processor 1002 is connected to a communication infrastructure 1004 (e.g., a communications bus, crossbar switch, or network). Various software embodiments are described in terms of this exemplary computer system.

Computer system 1000 can include a display interface 1006 that forwards graphics, text, and other data from communication infrastructure 1004 (or from a frame buffer not shown) for display on a display unit 1008.

Computer system 1000 also includes a main memory 1010, preferably a random access memory (RAM), and may also include a secondary memory 1012. Secondary memory 1012 may include, for example, a hard disk drive 1014 and/or a removable storage drive 1016, representing a floppy disk drive, a magnetic tape drive, an optical disk drive, etc. The removable storage drive 1016 reads from and/or writes to a removable storage unit 1018 in a well-known manner. Removable storage unit 1018, represents a floppy disk, magnetic tape, optical disk, etc. which is read by and written to by removable storage drive 1016. As will be appreciated, the removable storage unit 1018 includes a computer usable storage medium having stored therein computer software and/or data.

In some embodiments, secondary memory 1012 may include other similar means for allowing computer programs or other instructions to be loaded into computer system 1000. Such means may include, for example, a removable storage unit 1020 and an interface 1022. Examples of such may include a program cartridge and cartridge interface (such as that found in video game devices), a removable memory chip (such as an EPROM, or PROM) and associated socket, and other removable storage units 1020 and interfaces 1022 which allow software and data to be transferred from removable storage unit 1020 to computer system 1000.

Computer system 1000 may also include a communications interface 1024. Communications interface 1024 allows software and data to be transferred between computer system 1000 and external devices. Examples of communications interface 1024 may include a modem, a network interface (such as an Ethernet card), a communications port, a PCMCIA slot and card, etc. Software and data transferred via communications interface 1024 are in the form of signals, which may be electronic, electromagnetic, optical or other signals capable of being received by communications interface 1024. These signals are provided to communications interface 1024 via a communications path (i.e., channel) 1026. Channel 1026 carries the signals and may be implemented using wire or cable, fiber optics, a phone line, a cellular phone link, an RF link or other communications channels.

In this document, the terms "computer-readable medium" and "computer usable medium" are used to generally refer to media such as removable storage unit 1018, a hard disk installed in hard disk drive 1014, and/or memory. These computer program products are means for providing software to computer system 1000.

Computer programs (also called computer control logic) are stored in main memory 1010 and/or secondary memory 1012. Computer programs may also be received via communications interface 1024. Such computer programs, when executed, enable computer system 1000 to perform the features of the present invention as discussed herein. In particular, the computer programs, when executed, enable processor 1002 to perform the features of the present invention. Accordingly, such computer programs represent controllers of computer system 1000.

In an embodiment where the invention is implemented using software, the software may be stored in a computer program product and loaded into computer system 1000 using removable storage drive 1016, hard disk drive 1014, interface 1022, or communications interface 1024. The control logic (software), when executed by processor 1002, causes processor 1002 to perform the functions of the invention as described herein.

Of course, the invention can also be implemented using a combination of both hardware and software.

While this invention has been described in conjunction with specific embodiments thereof, the preferred embodiments of the invention as set forth herein are intended to be illustrative, not limiting.

The invention claimed is:

1. A method for maintaining an accurate frequency for a voltage controlled oscillator in a phase-locked loop, comprising the steps of:
   receiving, at a phase detector, a phase input signal and a phase feedback signal from the voltage controlled oscillator;
   measuring a pulse width property of a first error signal output from the phase detector to obtain a pulse width property measurement;
   storing the pulse width property measurement in a memory; and
   selecting, depending upon a status of the phase input signal, one of a second error signal output from the phase detector and a new signal generated based on the stored pulse width property measurement for supply to the voltage controlled oscillator to maintain the frequency of the voltage controlled oscillator.

2. The method of claim 1, wherein the new signal is selected when the phase input signal is lost.

3. The method of claim 1, wherein the new signal is selected when the phase input signal becomes unsuitable for proper operation of the phase-locked loop.

4. The method of claim 1, wherein the measuring step is performed at periodic intervals.

5. The method of claim 1, wherein the measuring step is performed as an initial on-site calibration function.

6. The method of claim 1, wherein the phase input signal is derived from a reference clock signal.

7. The method of claim 1, wherein the pulse width property comprises a pulse width of a high level of the first error signal and a pulse width of a low level of the first error signal, and the measuring step further comprises the steps of:
   detecting a first rising edge of the first error signal;
   starting a counter to measure the high level pulse width of the first error signal;
   detecting a falling edge of the first error signal;
   stopping the counter to obtain the high level pulse width;
   restarting the counter to measure the low level pulse width of the first error signal;
   detecting a second rising edge of the first error signal; and
   stopping the counter to obtain the low level pulse width.

8. The method of claim 1, wherein the pulse width property measurement comprises a high pulse width measurement of a high level of the first error signal and a pulse width measurement of a low level of the first error signal, and the new signal generation includes the steps of:
   starting a countdown counter from a count corresponding to the stored high level pulse width measurement;
   generating a high level of the new signal until the counter stops;
   restarting the counter to count down from a count corresponding to the stored low level pulse width measurement; and
   generating a low level of the new signal until the counter stops.

9. The method of claim 2, wherein in response to a reappearance of the phase input signal, the supplying of the new signal is terminated.

10. The method of claim 3, wherein in response to acquiring a suitable phase input signal, the supplying of the new signal is terminated.

11. A system comprising:
    a phase detector that generates a first error signal from a phase input signal and a phase feedback signal from a voltage controlled oscillator;
    a measurement circuit which measures a pulse width property of the first error signal;
    a memory module which stores the measured pulse width property;
    a generation circuit which retrieves the measured pulse width property from the memory module and which generates a new signal based thereon; and
    a selection circuit which selects, depending upon a status of the phase input signal, one of a second error signal and the new signal for supply to the voltage controlled oscillator to control the frequency of the voltage controlled oscillator.

12. A computer-readable medium containing a computer program for maintaining a frequency of a voltage controlled oscillator, said program including instructions for executing the steps of:
    receiving, at a phase detector, a phase input signal and a phase feedback signal from the voltage controlled oscillator;
    measuring a pulse width property of a first error signal output from the phase detector to obtain a pulse width property measurement;
    storing the pulse width property measurement in a memory; and
    selecting, depending upon a status of the phase input signal, one of a second error signal output from the phase detector and a new signal generated based on the stored pulse width property measurement for supply to the voltage controlled oscillator to phase-lock the voltage controlled oscillator.

13. The computer-readable medium of claim 12, wherein said step of measuring a pulse width property measures a duration of a high signal level and a duration of a low signal level of the first error signal, and said generation of the new signal generates a high signal level for a time duration corresponding to the measured high signal level and generates a low signal level for a time duration corresponding to the measured low signal level.

14. A method for calibrating a phase-locked loop circuit, comprising:
    receiving a phase input signal and a feedback signal into a phase detector such that the loop is phase-locked;
    measuring a pulse width property of a first error signal output from the phase detector;
    storing the measured pulse width property of the first error signal;
    using the stored pulse width property to generate a calibration reference signal, which can be supplied to a voltage controlled oscillator; and
    selectively supplying, to the voltage controlled oscillator, one of a second error signal output from the phase detector and the calibration reference signal, depending upon a status of the phase input signal.

15. A method of implementing clock holdover in a phase-locked loop circuit, comprising:
    receiving a phase input signal and a feedback signal into a phase detector such that the loop is phase-locked;

periodically measuring a pulse width property of an error signal output from the phase detector;

determining whether the measured pulse width property satisfies a predetermined condition over a predetermined period of time, and storing the measured pulse width property depending upon whether it satisfies the predetermined condition; and using the stored pulse width property to generate a new signal to be supplied to a voltage controlled oscillator when the phase input signal is lost or becomes unsuitable for proper operation of the phase-locked loop.

16. A method of qualifying a potential clock reference for a phase-locked loop circuit, said phase-locked loop circuit comprising a phase detector which receives a phase input signal and a phase feedback signal, a system clock, and a VCO, said method comprising:

a. determining a relative frequency measurement of the potential clock reference relative to the system clock;

b. measuring a pulse width property of an error signal output from the phase detector;

c. determining a frequency output of the VCO from the measured pulse width property; and d. determining whether the potential clock reference would lock the phase-locked loop from the determined relative frequency measurement and the determined VCO frequency output.

* * * * *